United States Patent [19]
Ohkusa et al.

[11] Patent Number: 5,975,011
[45] Date of Patent: Nov. 2, 1999

[54] APPARATUS FOR FABRICATING SPHERICAL SHAPED SEMICONDUCTOR INTEGRATED CIRCUITS

[75] Inventors: T. Ohkusa, Ichihara, Japan; Ram K. Ramamurthi, Allen, Tex.

[73] Assignee: Ball Semiconductor, Inc., Dallas, Tex.

[21] Appl. No.: 08/996,260

[22] Filed: Dec. 22, 1997

[51] Int. Cl.$^6$ ................................. C23C 16/00
[52] U.S. Cl. ............ 118/715; 118/723 E; 118/724; 156/345; 204/298.02; 204/298.07; 204/298.09
[58] Field of Search ............... 118/715, 723 E, 118/724; 156/345; 204/298.02, 298.07, 298.09

[56] References Cited

U.S. PATENT DOCUMENTS

| | | | |
|---|---|---|---|
| 4,788,082 | 11/1988 | Schmitt . | |
| 4,993,358 | 2/1991 | Mahawili | 118/715 |
| 5,792,269 | 8/1998 | Deacon et al. | 118/715 |
| 5,851,294 | 12/1998 | Young et al. | 118/715 |
| 5,876,504 | 3/1999 | Fuji et al. | 118/723 E |

OTHER PUBLICATIONS

Wang, Ma, Golz, Halpern & Schmitt/High–Quality MNS Capacitors Prepared by Jet Vapor Deposition at Room Temperature/ 1992 IEEE Magazine pp. 482–484.

Heberlein & Pfender/Thermal Plasma Chemical Vapor Deposition/ 1993 Materials Science Forum vol. 140–142, pp. 477, 480–498.

Kong & Pfender/Synthesis of Ceramic Powders in a Thermal DC Plasma Jet by Injection of Liquid Precursors/ 1988 Proc. 2nd Int. Conf. Ceram. Powder Proc., pp. 237–243.

U.S. Serial No. 08/858,004, filed on May 16, 1997, Shperical Shaped Semiconductor Integrated Circuit, Akira Ishikawa, Abstract and 15 sheets of drawings.

*Primary Examiner*—Leo B. Tentoni
*Attorney, Agent, or Firm*—Haynes and Boone, L.L.P.

[57] ABSTRACT

An apparatus and method for fabricating integrated circuits according to which a plurality of members of a semiconductor material are continuously introduced into a chamber. A process gas is introduced into the chamber in a direction extending at an angle to the direction of passage of the members into the chamber in a manner so that the gas contacts the members during its passage through the chamber to treat the members.

10 Claims, 1 Drawing Sheet

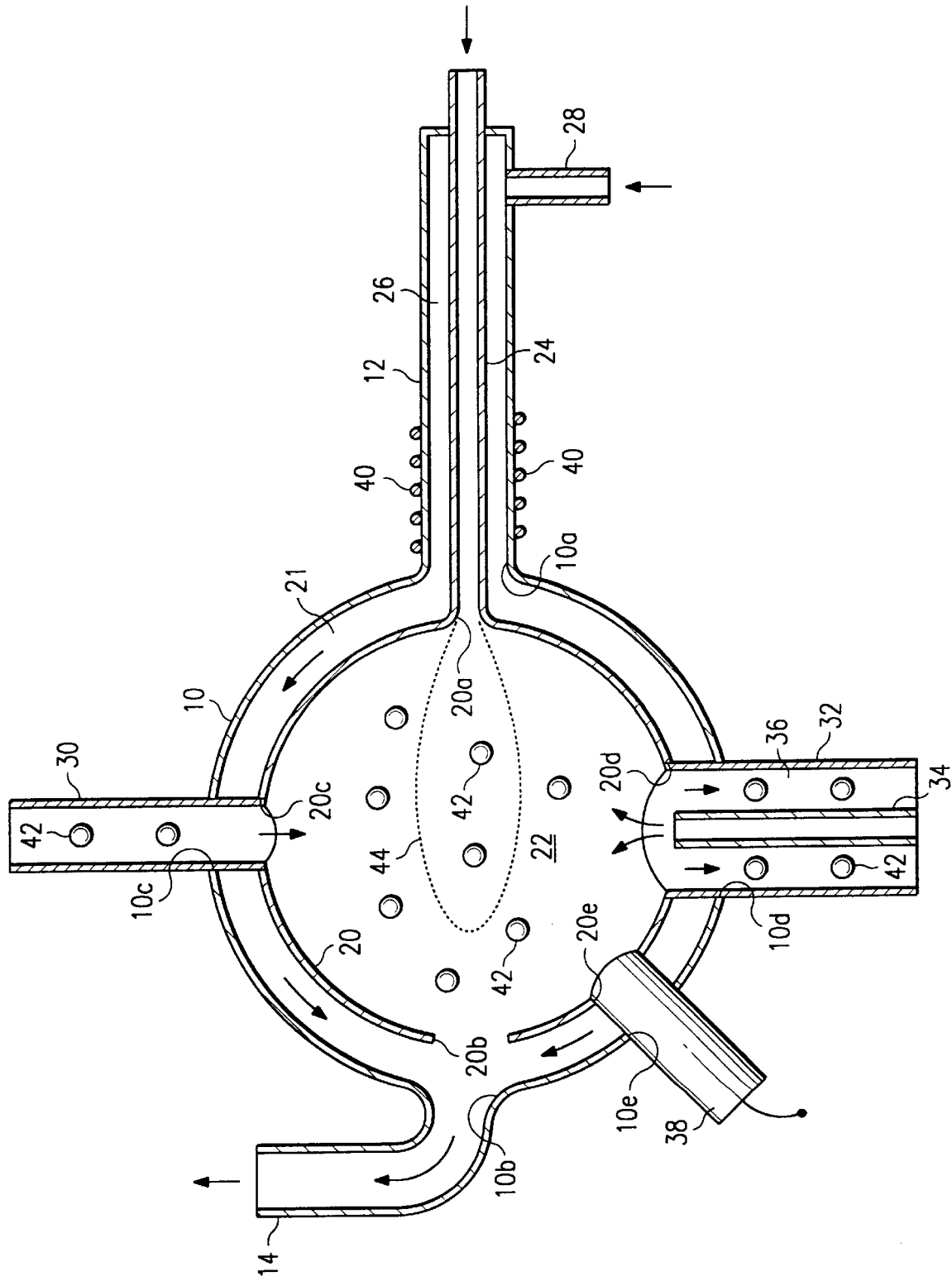

APPARATUS FOR FABRICATING SPHERICAL SHAPED SEMICONDUCTOR INTEGRATED CIRCUITS

BACKGROUND OF THE INVENTION

The invention relates generally to semiconductor integrated circuits, and more particularly, to an apparatus and method for fabricating a spherical-shaped semiconductor integrated circuit.

Conventional integrated circuits, or "chips," are formed from a flat surface semiconductor wafer. The semiconductor wafer is first manufactured in a semiconductor material manufacturing facility and is then provided to a fabrication facility. At the latter facility, several layers are processed onto the semiconductor wafer surface. Once completed, the wafer is then cut into one or more chips and assembled into packages. Although the processed chip includes several layers fabricated thereon, the chip still remains relatively flat.

A fabrication facility is relatively expensive due to the enormous effort and expense required for creating flat silicon wafers and chips. For example, manufacturing the wafers requires several high-precision steps including creating rod-form polycrystalline semiconductor material; precisely cutting ingots from the semiconductor rods; cleaning and drying the cut ingots; manufacturing a large single crystal from the ingots by melting them in a quartz crucible; grinding, etching, and cleaning the surface of the crystal; cutting, lapping and polishing wafers from the crystal; and heat processing the wafers. Moreover, the wafers produced by the above processes typically have many defects which are largely attributable to the difficulty in making a single, highly pure crystal due to the above cutting, grinding and cleaning processes as well as due to the impurities, including oxygen, associated with containers used in forming the crystals. These defects become more and more prevalent as the integrated circuits formed on these wafers become smaller.

Another major problem associated with modern fabrication facilities for flat chips is that they require extensive and expensive equipment. For example, dust-free clean rooms and temperature-controlled manufacturing and storage areas are necessary to prevent the wafers and chips from defecting and warping. Also, these types of fabrication facilities suffer from a relatively inefficient throughput as well as an inefficient use of the silicon. For example, facilities using in-batch manufacturing, where the wafers are processed by lots, must maintain huge inventories to efficiently utilize all the equipment of the facility. Also, because the wafers are round, and the completed chips are rectangular, the peripheral portion of each wafer cannot be used.

Still another problem associated with modern fabrication facilities is that they do not produce chips that are ready to use. Instead, there are many additional steps that must be completed, including cutting and separating the chip from the wafer; assembling the chip to a lead frame which includes wire bonding, plastic or ceramic molding and cutting and forming the leads, positioning the assembled chip onto a printed circuit board; and mounting the assembled chip to the printed circuit board. The cutting and assembly steps introduce many errors and defects due to the precise requirements of such operations. In addition, the positioning and mounting steps are naturally two-dimensional in character, and therefore do not support curved or three dimensional areas.

Therefore, due to these and various other problems, only a few companies in the world today can successfully manufacture conventional flat chips. Furthermore, the chips must bear a high price to cover the costs of manufacturing, as well as the return on initial capital and investment.

In co-pending U.S. patent application Ser. No. 08/858,004 filed on May 16, 1997, assigned to the same assignee as the present application and hereby incorporated by reference, a method and apparatus for manufacturing spherical-shaped semiconductor integrated circuits is disclosed. The present invention is specific to an apparatus and method for performing fabrication steps on the circuits.

SUMMARY OF THE INVENTION

The present invention, accordingly, provides an apparatus and method for fabricating a spherical shaped semiconductor integrated circuit according to which a chamber is provided into which spheres of a semiconductor material are continuously introduced into the chamber for movement through the chamber. Process gases are selectively introduced into the chamber at an singular direction relative to the direct of passage of the spheres through the chamber. Thus, the gases contact the spheres and treat the spheres according to a particular aspect of the fabrication process.

Several advantages result from the foregoing. For example the process gases can treat the spheres in several manners including depositing a thin film on the spheres, performing diffusion (doping), oxidizing the spheres, etc. Also, the spheres can be continuously introduced into the chamber to reduce or eliminate the need for a clean room environment. Also, the chamber can be maintained at a relatively high temperature above conventional semiconductor material warping or melting points. Further, the spherical shape of the circuit provides much greater surface area on which the process gas acts, when compared to the surface area of a conventional flat semiconductor. Still further, the method of the present invention can be carried out in a relatively small space and eliminates the requirements for assembly and packaging facilities.

BRIEF DESCRIPTION OF THE DRAWINGS

The drawing is a cross-sectional view of the apparatus of the present invention.

DESCRIPTION OF THE PREFERRED EMBODIMENT

Referring to the drawing, the reference numeral 10 refers, in general, to an enclosure in the form of a hollow sphere having an inlet opening 10a and an outlet opening 10b located diametrically opposite the inlet opening 10a. One end of a horizontally extending inlet conduit 12 registers with the inlet opening 10a of the sphere 10, and one end of a generally U-shaped outlet conduit 14 registers with the outlet opening 10b. It is understood that the conduits 12 and 14 are connected to the sphere 10 in any known manner and, alternately, can be formed integrally with the sphere.

A hollow inner sphere 20 extends within the sphere 10 in a coaxial, slightly spaced relationship to define a substantially spherical passage 21 therebetween. The inner sphere 20 has an inlet opening 20a and an outlet opening 20b registering with a chamber 22 defined by the interior of the sphere, with the outlet opening 20b being located diametrically opposite the inlet opening 20a. One end of a horizontally extending inlet conduit 24 registers with the inlet opening 20a of the inner sphere 20, and is connected to the sphere 10 in any known manner. The inlet conduit 24 extends within the inlet conduit 12 in a spaced relation thereto to define, with the inlet conduit 12, a cylindrical inlet passage 26 that communicates with the passage 21. Although not shown in the drawings, it is understood that the conduit 24 is supported within the conduit 12 in any known manner such as by struts, or the like. A nipple 28, or the like, is connected to the distal end portion of the inlet conduit 12 to introduce a first fluid into the passage 26, and the distal end of the inlet conduit 24 is open so as to provide an inlet to receive one or more additional fluids. For example, the first fluid introduced into the passage 26 via the nipple 28 could be a cooling fluid and the fluids introduced into the inlet conduit 24 could be a plasma gas and a process gas which function in a manner to be described.

A second inlet opening 20c and a second outlet opening 20d are formed through the inner sphere 20. The openings 20c and 20d are diametrically opposed and extend in a ninety degree, angularly spaced, relation to the openings 20a and 20b. A pair of diametrically opposed openings 10c and 10d are formed through the outer sphere 10 and are aligned with the openings 20c and 20d, respectively, of the inner sphere 20.

A vertically extending inlet conduit 30 extends through the opening 10c in the outer sphere 10 and registers with the opening 20c of the inner sphere 20. A vertically extending outlet conduit 32 extends through the opening 10d in the outer sphere 10 and registers with the opening 20d in the inner sphere 20. A conduit 34 extends within the outlet conduit 32, through the opening 10d in the outer sphere, and also registers with the opening 20d of the inner sphere 20. The diameter of the conduit 34 is less than that of the outlet conduit 32 so as to form a cylindrical passage 36 which also registers with the opening 20d of the inner sphere 20. Although not shown in the drawings, it is understood that the conduit 34 is supported within the conduit 32 in any known manner such as by struts, or the like.

A temperature measurement unit 38 registers with a openings 10e and 20e in the outer sphere 10 and the inner sphere 20, respectively, and includes an optical (infrared) temperature measuring device, or the like, to measure the temperature in the interior of the chamber 22, as will be described. Since this type of unit is conventional, it will not be described in detail. An electrical conductor 40 is coiled around the outer surface of the conduit 12 for creating a radio frequency signal in connection with a plasma process that may be performed in connection with the chamber 22 as described below.

In operation, a plurality of members 42, each of a polycrystal semiconductor material, are introduced into the inlet conduit 30 and pass into the chamber 22 in the inner sphere 20. The members 42 are preferably of a generally spherical shape and could be of the same type formed according to the technique disclosed in the above-identified and presently incorporated patent application Ser. No. 08/858,004. After traversing the interior of the chamber 22, the members 42 pass through the outlet opening 20d in the inner sphere 20 before discharging from the chamber 22 through the conduit 32. The introduction and discharge of the members 42 in this manner is controlled to prevent the accumulation of a relatively large number of members in the chamber 22 at the same time. To this end, a fluid, such as an inert carrier gas, is introduced into the conduit 34 and therefore passes upwardly, as viewed in the drawing, into the chamber 22, with the velocity of the gas being controlled so that the discharge of the members 42 through the conduit 32 is controlled.

During this flow of the members 42 through the chamber, one or more gases are selectively introduced into the inlet end of the inlet conduit 24 and thus flow directly into the chamber 22. The particular gases that are introduced into the chamber depends on the specific desired treatment of the members 42. As an example, a gas, such as oxygen, hydrogen, or the like that is capable of being converted to a plasma gas in a manner to be described, is introduced into the conduit 24 and passes into and through the chamber 22 in a direction that extends approximately ninety degrees to the direction of the passage of the members 42 through the chamber. This gas (hereinafter referred to as a "plasma gas") establishes a region 44, shown enclosed by the phantom lines in the drawing, through which the members 42 pass. The plasma gas therefore passes over the members 42 in the chamber and comes into intimate contact with the members. The velocity and mass flow of the plasma gas introduced into the chamber 22 in this manner is controlled so that the plasma gas passes through the chamber, exits the chamber through the outlet opening 20b in the inner sphere 20, and passes into the conduit 14 for discharge. During the passage of the plasma gas through the chamber 22, the RF coil 40 is activated and the plasma gas, in combination with RF current from the coil, becomes an inductively coupled plasma. As a result, relatively high energy is created and applied to the region 44 in the chamber 22. Since this formation of an inductively coupled plasma, and the resultant creation of relatively high energy is well known in the art it will not be described in any further detail.

During this process, a coolant gas is introduced into the nipple 28 as needed and thus flows through the passage 26 and into and through the passage 21 in a heat exchange relation with the inner sphere 20 for cooling the inner sphere. For safety purposes, the coolant gas also carries away any toxic process gas leakage from the chamber 22, in the event the inner sphere 20 cracks. After passing through the passage 21, the coolant gas passes through the outlet opening 10b of the outer sphere 10 and into the conduit 14 for discharge with the plasma gas from the chamber 22. The temperature of the coolant gas, and the amount of the plasma gas and the coolant gas introduced into the passage 21, are controlled to maintain the temperature in the chamber 22 at value, above the melting temperature of the members 42. As an example, the temperature in the chamber is maintained at approximately 5000 degrees centigrade, as indicated by the temperature measuring unit 38.

The melted members 42 are then discharged from the chamber 22 and cooled. This melting and subsequent cooling of the members 42 converts each member from a polycrystal element to a single crystal element.

After, the members 42 have been converted to single crystal elements in the foregoing manner, the introduction of the plasma gas into the chamber 22 in the foregoing manner is terminated. The cooled, single crystal members 42 are then reintroduced into a chamber similar to the chamber 22 in the manner described above, and a process gas is introduced into the chamber via the conduit 24 for further treating the members. This latter treatment could be the deposit of a thin film on the members, the diffusion, or doping, of the members, or the oxidation of the members, all part of the fabrication of a semiconductor, as disclosed in the above-reference patent application. Since the particular process gases that are utilized in this manner do not, per se, form a part of the present invention, they will not be described in further detail.

The apparatus and method of the present invention leads to several advantages. For example, the continuous flow of the members 42 through the chamber 22, and the above-mentioned chamber similar to the chamber 22, reduces or eliminates the need for batch processing. Also, the chambers can be selectively maintained at a relatively high temperature at or above the warping or melting temperature of the members 42, by controlling the amount of inductively coupled plasma gas formed in the chambers. Further, the spherical shape of the members 42 provide much greater surface area on which the process gas acts, when compared to the surface area of a conventional flat semiconductor. Also, the method of the present invention can be carried out in a relatively small space and eliminates the requirements for large facilities. Still further, the chambers can be used for many different processing steps depending on the type of processing gases that are introduced.

It is understood that several variations may be made in the foregoing. For example, the invention is not limited to the specific orientation of the various inlet and outlet conduits relative to the chamber 22 described above. Thus the members 42 and the gases can travel in a direction through the chamber 22 other than a vertical and horizontal direction, respectively, as described above. Also the direction of the flow of the gases through the chamber 22 can extend at an angle other than ninety degrees relative to the direction of the passage of the members 42 through the chamber.

It is understood that other modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. An apparatus for fabricating integrated circuits, the apparatus comprising an enclosure defining a chamber, a first inlet registering with the chamber for receiving a plurality of members of a semiconductor material, a second inlet registering with the chamber for receiving at least one gas for treating the members, the second inlet being oriented relative to the first inlet to direct the gas into the chamber at an angle to the direction of passage of the members into the chamber so that the gas contacts the members during the members' passage through the chamber, a first outlet registering with the chamber for receiving and discharging the members from the chamber, and a second outlet registering with the chamber for receiving and discharging the gas from the chamber.

2. The apparatus of claim 1 wherein the chamber is constructed to receive an inductively coupled plasma gas to raise the temperature in the chamber to a relatively high value.

3. The apparatus of claim 2 wherein the second inlet is constructed to provide the inductively coupled plasma gas.

4. The apparatus of claim 1 wherein the chamber is spherical, and wherein the second inlet is angularly spaced approximately ninety degrees from the first inlet.

5. The apparatus of claim 4 wherein the first outlet is diametrically opposed to the first inlet and wherein the second outlet is diametrically opposed to the second inlet.

6. The apparatus of claim 1 further comprising a passage for introducing cooling fluid in a heat exchange relation with the enclosure to cool the chamber.

7. The apparatus of claim 6 wherein the enclosure is spherical, and further comprising an outer sphere extending around the enclosure in a spaced relation thereto for defining the passage.

8. The apparatus of claim 7 further comprising a first inlet conduit registering with the first inlet for introducing the members to the first inlet, and a second inlet conduit registering with the second inlet for introducing the process gas to the second inlet.

9. The apparatus of claim 8 further comprising a third inlet conduit for introducing the cooling fluid into the passage, the third inlet conduit extending around the second inlet conduit in a coaxial, spaced relation.

10. The apparatus of claim 9 further comprising a conduit for directing a fluid towards the members as the members discharge from the chamber to control the discharge of the members from the chamber.

* * * * *